United States Patent [19]

Havemann

[11] Patent Number: 5,482,894
[45] Date of Patent: Jan. 9, 1996

[54] METHOD OF FABRICATING A SELF-ALIGNED CONTACT USING ORGANIC DIELECTRIC MATERIALS

[75] Inventor: Robert H. Havemann, Garland, Tex.

[73] Assignee: Texas Instruments Incorporated, Dallas, Tex.

[21] Appl. No.: 294,290

[22] Filed: Aug. 23, 1994

[51] Int. Cl.$^6$ ................................................ H01L 21/44
[52] U.S. Cl. ...................... 437/195; 437/228; 437/236; 437/203; 156/644.1; 156/651.1
[58] Field of Search .................................. 437/195, 231, 437/52, 48, 60, 228, 235, 236, 203, 919, 238; 156/644.1, 651.1

[56] References Cited

U.S. PATENT DOCUMENTS

| | | | |
|---|---|---|---|
| 4,576,900 | 3/1986 | Chiang | 430/313 |
| 4,683,024 | 7/1987 | Miller et al. | 156/643 |
| 4,980,316 | 12/1990 | Huebner | 437/228 |
| 5,037,777 | 8/1991 | Mele et al. | 437/195 |
| 5,069,747 | 12/1991 | Cathey et al. | 156/643 |
| 5,100,838 | 3/1992 | Dennison | 437/195 |
| 5,198,298 | 3/1993 | Haskell et al. | 428/336 |
| 5,200,358 | 4/1993 | Bollinger et al. | 437/180 |
| 5,246,883 | 9/1993 | Lin et al. | 437/195 |
| 5,279,989 | 1/1994 | Kim | 437/195 |
| 5,371,047 | 12/1994 | Greco et al. | 437/238 |
| 5,393,712 | 2/1995 | Rostoker et al. | 437/235 |

FOREIGN PATENT DOCUMENTS 0105923  5/1991  Japan .
0127454  4/1992  Japan .

OTHER PUBLICATIONS

Ser. No. 08/234,100, Apr. 27, 1994, Havemann.
Ser. No. 08/234,099, Apr. 27, 1994, Havemann

*Primary Examiner*—Tuan H. Nguyen
*Attorney, Agent, or Firm*—James E. Harris; Richard L. Donaldson; Richard A. Stoltz

[57] ABSTRACT

A semiconductor device and process for making the same are disclosed which incorporate organic dielectric materials to form self-aligned contacts (SACTs) reliably, even in deep, narrow gaps. In one embodiment, conductors 26 with insulating conductor caps 28 are formed over a silicon substrate 20 with a thin gate oxide 22. A conformal dielectric layer 30, preferably of thermally-grown oxide, is deposited over this structure, which is then covered with an organic-containing layer 32 and an inorganic cap layer 34 (e.g., CVD TEOS). An etch window 38 is patterned in photoresist layer 36 and used as a mask to etch cap window 39 through layer 34, using layer 32 as an etch stop. A second etch removes organic-containing layer 32 in contact window 41 (and preferably strips photoresist), using conformal layer 30 as an etch stop. A short anisotropic etch may be used to clear conformal layer 30 from gap bottom 43, after which conducting material 40 may be used to make electrical contact to the substrate.

11 Claims, 5 Drawing Sheets

METHOD OF FABRICATING A SELF-ALIGNED CONTACT USING ORGANIC DIELECTRIC MATERIALS

CROSS-REFERENCE TO RELATED APPLICATIONS

The following co-assigned U.S. patent applications are hereby incorporated herein by reference:

| TI Case | Ser. No | Filing Date | Inventor | Title |
| --- | --- | --- | --- | --- |
| TI-19070 | 08/234,100 | 4/27/94 | Havemann | Self-Aligned Via Using Low Permittivity Dielectric |
| TI-19071 | 08/234,099 | 4/27/94 | Havemann | Via Formation In Polymeric Materials |

FIELD OF THE INVENTION

This invention relates to fabrication of semiconductor devices and more particularly to the formation of self-aligned contacts on such devices.

BACKGROUND OF THE INVENTION

Semiconductors are widely used in integrated circuits for electronic devices such as computers and televisions. These integrated circuits may contain millions of transistors fabricated on a single crystal silicon chip to perform complex functions and store data. Integrated circuits are commonly constructed by sequentially forming transistor active regions, insulating films, and patterned conducting films in a predetermined arrangement on a semiconductor substrate. Active regions and conducting films must be accurately aligned if the circuit is to function properly; therefore, self-aligning features (features whose placement is at least partially determined by the location of previously fabricated features) are highly desirable.

To facilitate extremely dense circuit layouts, it is desirable at times to fabricate the lowest conductor level (which typically includes transistor gates) with conductors at minimum spacing. Unfortunately, such spacing may make a self-aligned contact (SACT) necessary for, e.g., electrically connecting to source/drain active regions located in the narrow gaps between the conductors. One method for forming a SACT directly between closely spaced features is described by Bollinger, et al., in U.S. Pat. No. 5,200,358, issued on Apr. 6, 1993. In this method, first and second dielectric layers are deposited over gate level conducting features. A selective etch process is used to facilitate the opening of contact holes between the conducting features. The selective etch process is designed to remove material from the second dielectric layer faster than it removes material from the first dielectric layer. Silicon nitride and silicon dioxide (of different varieties) are used for the dielectric layers; relative etch selectivity for the best of such dielectric combinations is on the order of 10:1.

A method such as that described in the '358 patent is generally useful when the aspect ratio (ratio of gap height to gap width) of the gap between the conducting features is low; as the aspect ratio increases (which it generally does when device geometries shrink), the first dielectric layer must be made increasingly thick to insure that the insulation protecting the underlying conducting features will not be perforated during contact window etching. At some geometry, this method becomes ineffective for reliably forming such self-aligned contacts; the limited selectivity between dielectric layers and limited etch anisotropy (ability to etch in one direction only, e.g. vertically) make such a process difficult for high aspect ratio gaps.

SUMMARY OF THE INVENTION

The present invention relates to a method of producing and a structure for self-aligned contacts on semiconductor devices. This is apparently the first self-aligned contact design capable of reliably forming contacts in narrow, high-aspect ratio gaps (e.g., less than 0.5 µm wide, 2:1 and greater aspect ratios). However, the invention may provide advantages for SACTs in general: a high quality conformal dielectric such as thermal oxide may be used as insulation between an SACT and adjacent conductors; this oxide may be made relatively thin for enhancing a capacitive storage node (e.g. DRAM applications); "notching" of such insulation may be prevented; a dielectric with excellent gap-fill, planarity, a relatively low dielectric constant, and etch selectivity to oxide greater than 100:1 is provided. These and other advantages will become apparent after reading this disclosure.

Organic-containing materials have many perceived disadvantages which have, in general, precluded their use as semiconductor dielectrics. These disadvantages include: instability and out-gassing at modest (generally less than 500° C.) temperatures; application by wet methods where vapor deposition is preferred; and an incapacity to withstand photoresist stripping operations. However, it has now been found that certain organic-containing materials are substantially unaffected by etching which is wholly effective on materials such as oxides and nitrides; conversely, the present invention includes etch procedures which may selectively remove such organic-containing materials without substantially affecting exposed inorganic dielectrics (e.g., oxide or nitride).

Consequently, the present invention includes a method of forming a self-aligned contact on a semiconductor device. In this method, two conductors of a predetermined height are provided on a substrate, preferably with each containing an insulating conductor cap at least in the vicinity where the SACT is to be formed. These conductors are preferably separated by a predetermined spacing. Over these conductors and the surrounding substrate, a conformal dielectric layer may be formed, thereby creating an insulated gap of predetermined width between the conductors. An organic-containing dielectric layer may then be deposited over the conductors, preferably to a depth sufficient to completely cover the conductors and fill the insulated gap. An inorganic cap layer may then be deposited over the organic-containing dielectric layer. A cap window may be etched through the cap layer, substantially vertically aligned with the insulated gap, preferably using the organic-containing dielectric layer as an etch stop. A contact window may subsequently be etched through the organic-containing dielectric layer, using the cap window as a mask, and using an etchant which does not substantially affect the conformal dielectric layer material.

Preferably, a short anisotropic etch of the conformal layer follows these steps if contact is to be made to the substrate in the gap (which may then be followed by a deposition of conducting material in the gap to form an electrical contact to the substrate). The insulating conductor cap may preferably be comprised principally of silicon dioxide, silicon nitride, or silicon oxynitride. The conformal dielectric layer may likewise be comprised of one or more layers of silicon dioxide, silicon nitride, or silicon oxynitride (and most preferably of thermally-grown oxide). As an aid to processing, it is preferable that the organic-containing dielectric layer etching step also strip any photoresist which may exist at that point above the cap layer.

The present invention also provides a structure for a self-aligned contact comprising two conductors formed on a substrate, substantially parallel over a predetermined length, and separated by a predetermined spacing. These conductors preferably include an insulative conductor cap, at least in the vicinity of the self-aligned contact. The structure further comprises a conformal dielectric layer adhering at least to the facing sides of the two conductors, thereby creating an insulated gap of predetermined width between the conductors (the conformal layer may be found on other portions of the conductors or substrate, since this may simplify processing). The structure may further comprise a conducting material disposed in the insulated gap, at least along one section of the predetermined length. The structure further comprises an organic-containing dielectric layer disposed in portions of the insulated gap other than the section filled with conducting material. An inorganic cap layer may be deposited overlying the organic-containing dielectric layer.

The conducting material may contact the substrate in the gap between the conductors. The two conductors may contain multiple conducting sublayers (preferably a polysilicon underlayer and a polycide overlayer). The organic-containing layer preferably contains 10% to 100% by weight organic material, preferably with the remainder comprised substantially of silicon dioxide.

BRIEF DESCRIPTION OF THE DRAWINGS

This invention, including various features and advantages thereof, can be best understood by reference to the following drawings, wherein.

DETAILED DESCRIPTION OF THE PREFERRED EMBODIMENTS

One method of forming a SACT by the present invention is illustrated in FIG. 1. In FIG. 1A, a thin gate oxide 22 (e.g. of thermally-grown silicon dioxide) is shown over a substrate 20. A conducting layer 16, which may be polysilicon with a refractory metal silicide overlayer (not shown), is deposited over the gate oxide, followed by insulating layer 18, which may, for example, be additional thermally-grown oxide.

Figure 1A:
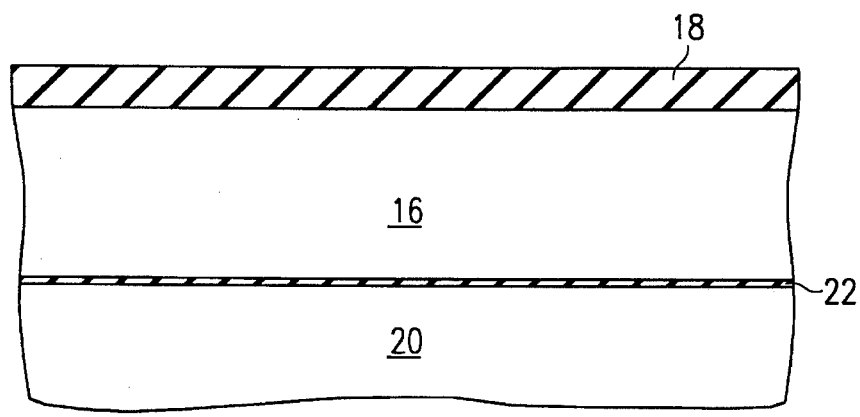
FIGS. 1A–1I show cross-sectioned elevations of one embodiment of a self-aligned contact made according to a method of the invention.
Figure 1B:
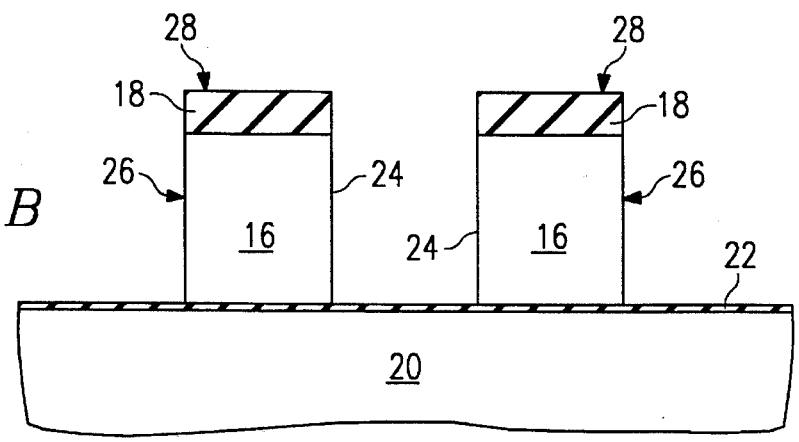
Figure 1C:
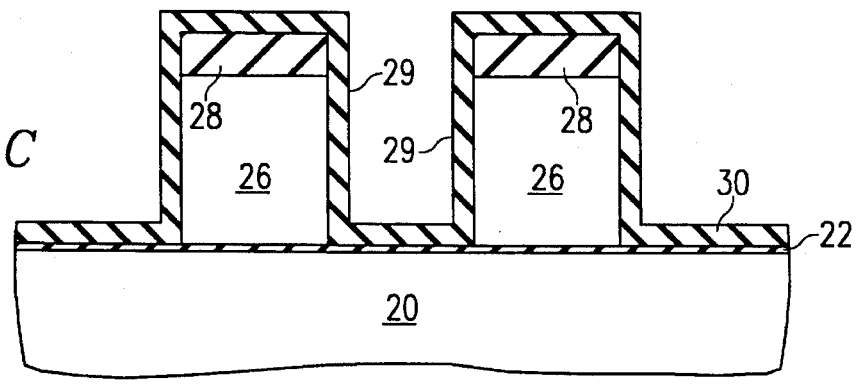

FIG. 1B shows the structure after patterning and etching by known methods to form two conductors 26, including insulating conductor caps 28, separated by a gap 24 with a relatively high aspect ratio (1.4:1 aspect ratio shown). FIG. 1C shows a conformal dielectric layer 30 (e.g. of thermally-grown oxide) over gate oxide 22, conductors 26 and conductor caps 28. Layer 30 adheres to the facing walls of conductors 26, forming insulated gap 29. With a dielectric layer 30 deposition thickness only 15% the width of gap 24 (FIG. 1B), the aspect ratio of insulated gap 29 is shown to be 2:1, illustrating the desirability of a method which requires only a thin dielectric layer 30.

Figure 1D:
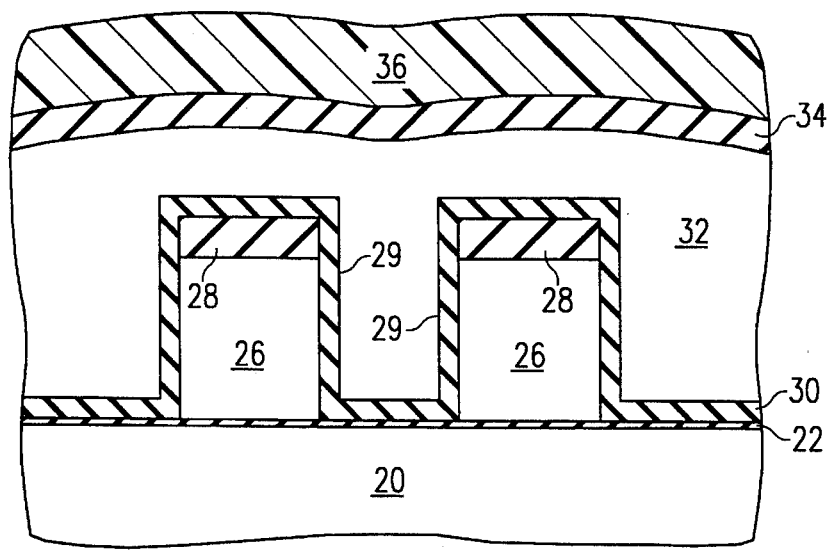

FIG. 1D shows several additional layers, the first of which is an organic-containing dielectric layer 32, preferably deposited to fill insulated gap 29 as well as cover conductors 26 (including conformal layer 30). Layer 32 may be constituted, for example, of a spin-on glass (SOG) such as the Allied Signal 515 series low-k (dielectric constant of about 2) SOG, which contains 30%–40% organic polymer by weight. After application and drying of organic-containing layer 32, the entire intermediate structure is preferably annealed, e.g. at 425° C. for 60 minutes in a nitrogen atmosphere. An inorganic cap layer 34 may then be deposited over layer 32 by one of several known methods, including plasma-enhanced chemical vapor deposition (CVD) of silicon dioxide from tetraethoxysilane (TEOS). The cap layer should, in general, be designed such that it will not be totally removed by later etch steps. A layer of photoresist 36 may subsequently be applied over cap layer 34 in preparation for patterning.

Figure 1E:
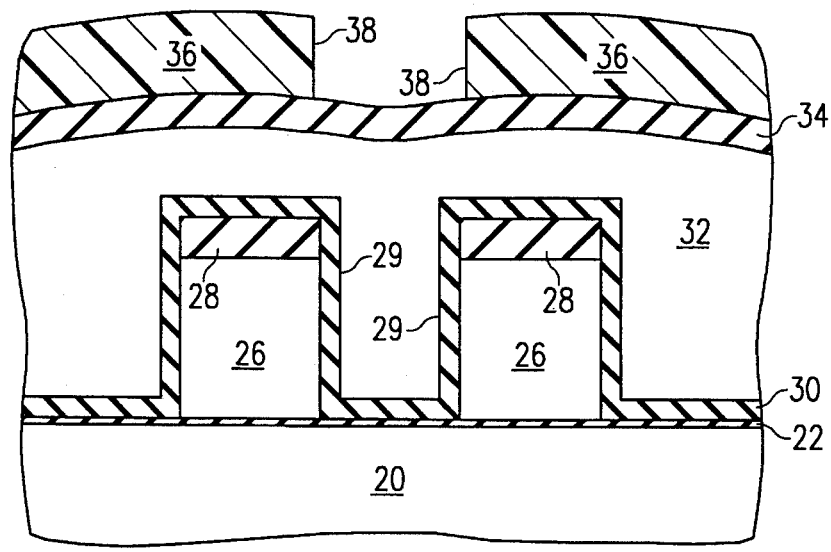
Figure 1F:
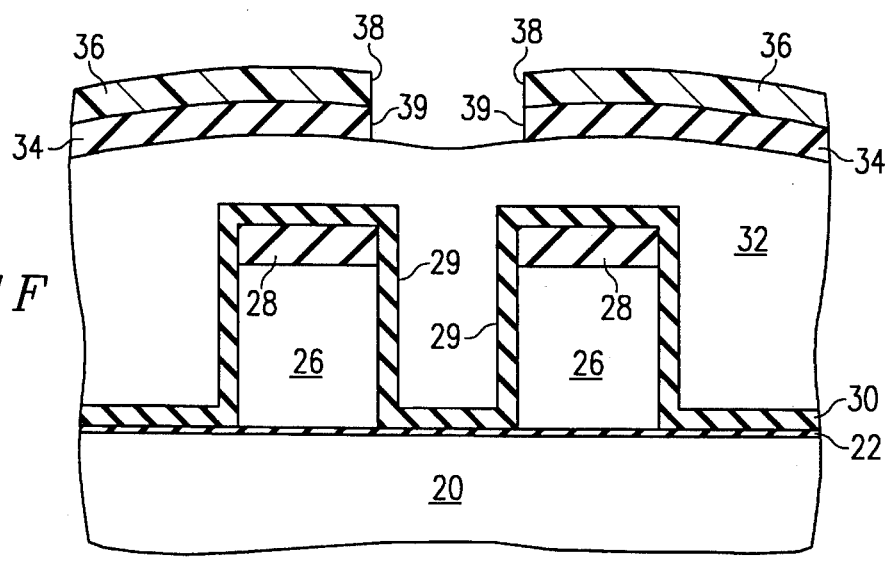

FIG. 1E illustrates an etch window 38 formed in photoresist 36. This etch window is preferably wider than, and substantially vertically aligned with, insulated gap 29. FIG. 1F shows that etch window 38 supplies a pattern for etching cap layer 34 to create cap window 39. Preferably, organic-containing layer 32 acts as an etch stop to this process. It has been found, for example, that fluorocarbon etchants (e.g., $C_2F_6$) in a high density plasma (HDP) reactor, such as the commercially available Applied Materials Omega-Centura 5300, etch TEOS oxide, e.g. layer 34, and yet do not substantially etch materials similar to organic-containing example Allied Signal 515 Series (e.g. layer 32).

Figure 1G:
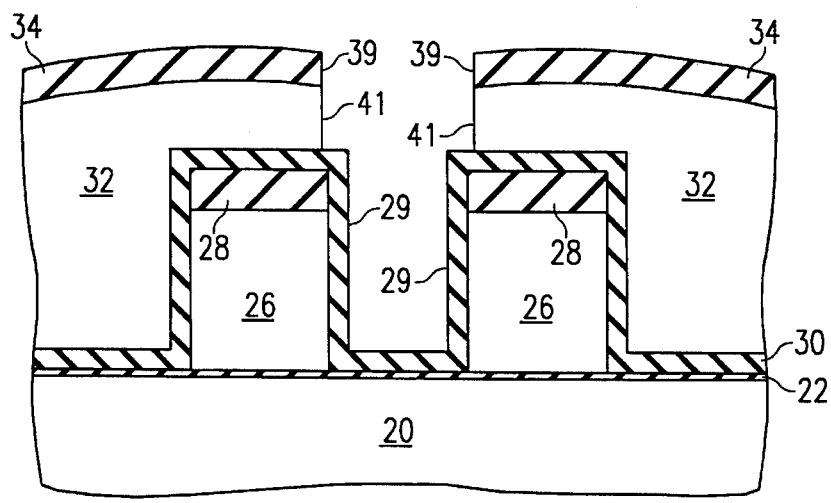

Cap window 39 supplies a pattern for etching a contact window through organic-containing layer 32 by a suitable anisotropic (substantially in one direction, usually vertical) etch. As shown in FIG. 1G, a contact window 41 is preferably etched through organic-containing layer 32, preferably clearing the portion of layer 32 directly underlying cap window 39 and stopping on layer 30. This etch may, for example, be accomplished using an $O_2$ plasma etch in the aforementioned HDP reactor. Advantageously, this etch may also be used to simultaneously strip photoresist 36 from the device. Note that after removal of the photoresist, cap layer 34 acts as a hard mask, preventing the $O_2$ plasma etch from affecting the organic-containing layer in regions other than contact window 38.

Figure 1H:
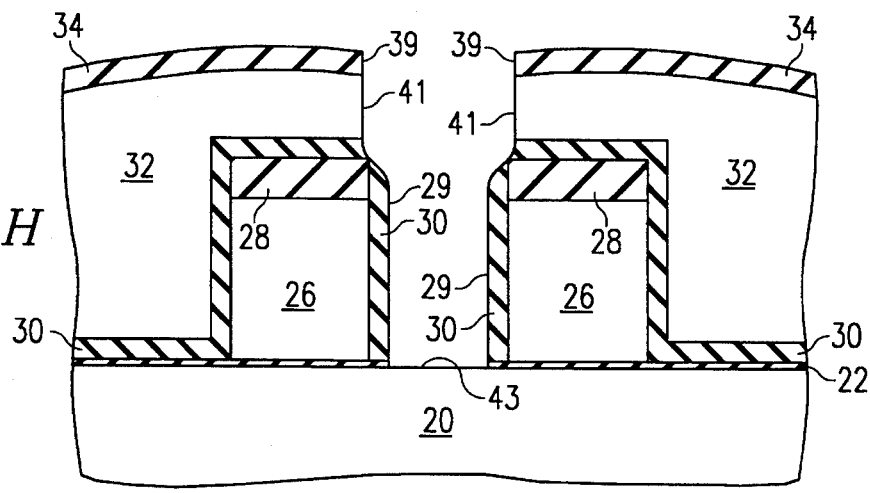
Figure 1I:
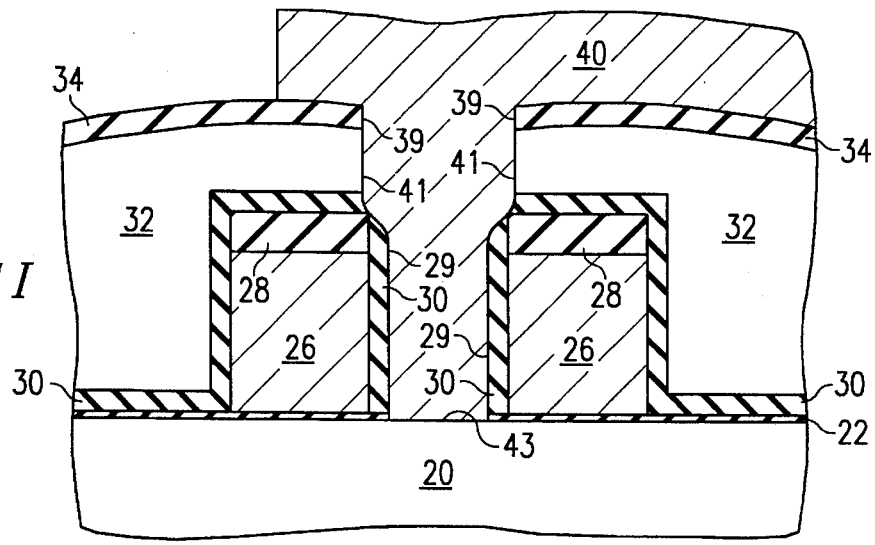

As shown in FIG. 1H, a short anisotropic etch may be used to remove conformal layer 30 and gate oxide 22 from gap bottom 43. Such an etch may thin cap layer 34, as shown, particularly if similar materials are used for both layers 30 and 34. This etch also generally attacks layer 30 where it covers the top corners of conductors 26, since these corners are exposed by an oversized and/or misaligned contact window, as shown. This situation may necessitate insulating conductor caps 28 simply to provide etch margin above conductors 26; otherwise, conductors 26 might be exposed by the etch of conformal layer 30, resulting in the formation of a short in the final structure. Finally, as illustrated in FIG. 1I, contact plug 40, formed of a conducting material (e.g. a composite comprised of a refractory metal underlayer with a tungsten overlayer) may be deposited in cap window 39 and contact window 41 (which includes the portion of insulated gap 29 underlying window 39) to form a contact to the substrate at gap bottom 43.

Figure 2A:
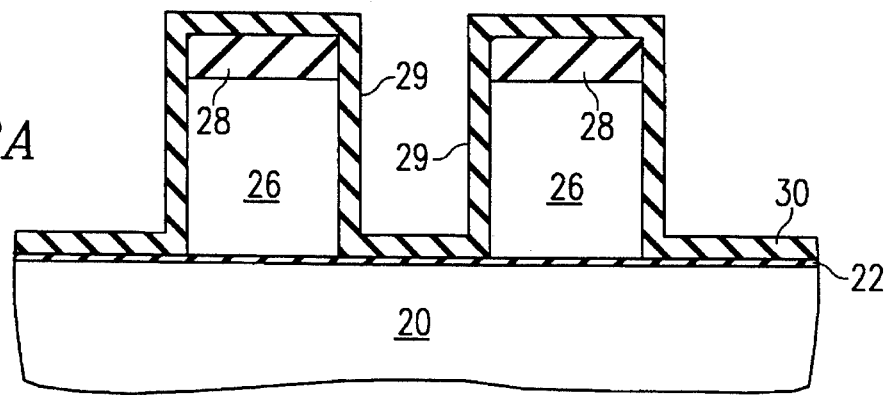
FIGS. 2A–2D show a cross-sectioned elevation of a second embodiment wherein a conformal layer is constructed in multiple steps.
Figure 2B:
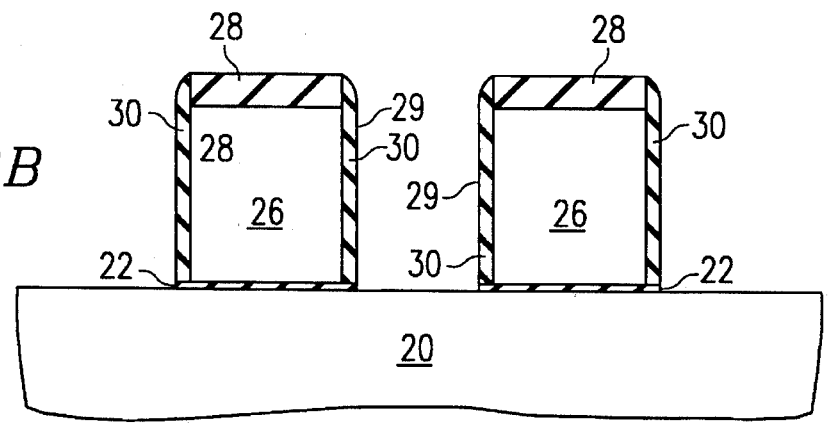

A second SACT embodiment is illustrated in FIGS. 2A–2D. The intermediate structure as shown in FIG. 2A may, for example, be constructed in a manner similar to FIG. 1C. However, this intermediate structure is then anistropically etched by known methods to remove conformal dielectric 30 (and possibly gate oxide 22) from horizontal exposed surfaces. This step may thin conductor caps 28 (as shown). Conformal dielectric 30 deposited on the sidewalls of conductors 26 may also be thinned at this point (e.g., if layer 30 is used in a known manner to align ion implantation to substrate 20, layer 30 may require thinning after implantation to reduce the aspect ratio of insulated gap 29).

Figure 2C:
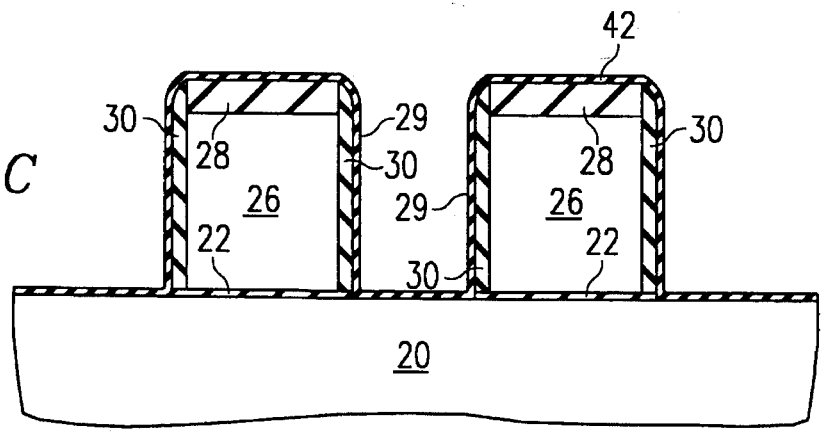
Figure 2D:
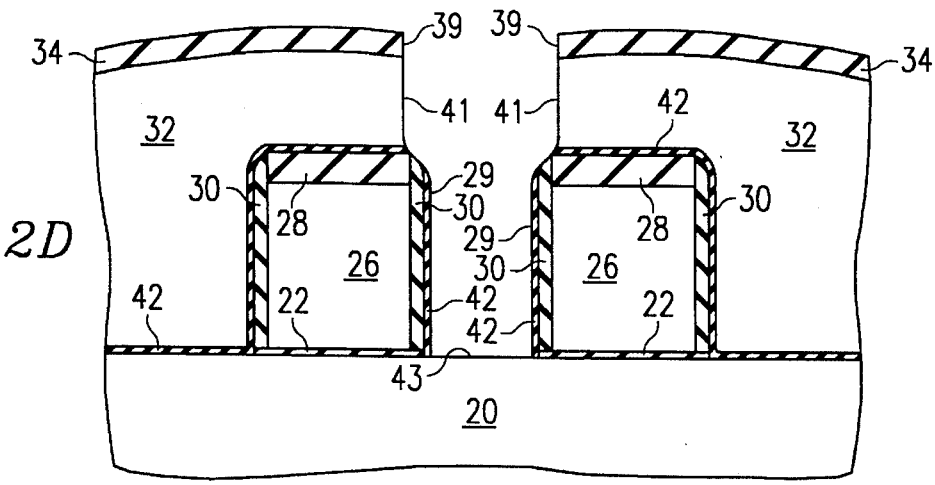

Additional material may subsequently be deposited as a conformal dielectric overlayer 42, e.g., using thermal oxide or silicon nitride (see FIG. 2C). This layer provides a minimal protection for substrate 20 during the $O_2$ plasma etch to remove organic-containing material from insulated gap 29. FIG. 2D shows this embodiment after additional deposition and patterning similar to that of the first embodiment. However, notching of conductor caps 28 prevalent in the prior art is virtually eliminated, because only the extremely thin overlayer 42 must be removed to open the contact window to substrate 20. If conformal layer 30 and overlayer 42 differ in materials (e.g. thermal oxide and nitride), relative selectivity between the two materials may also be exploited to design a structure wherein conductor caps 28 are extremely thin.

Figure 3:
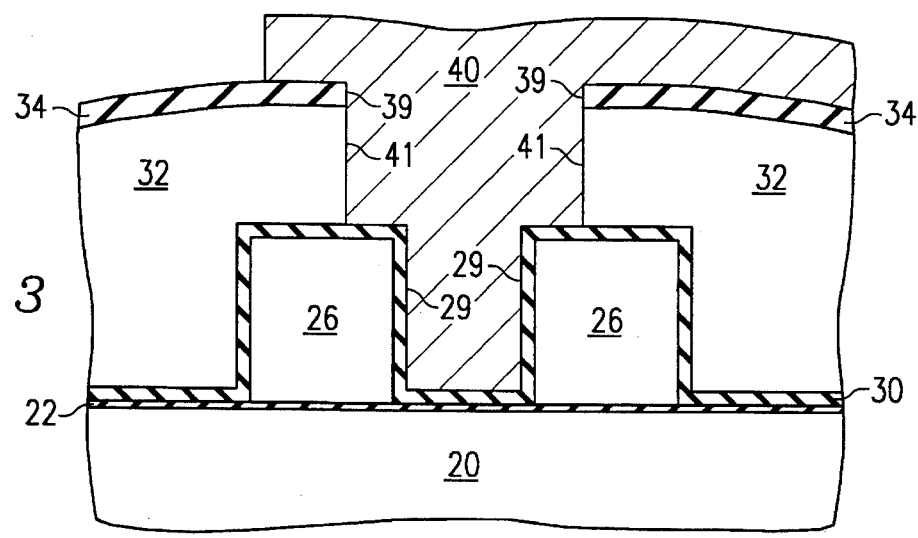
FIG. 3 shows a cross-sectioned elevation of an embodiment wherein no contact is made to the substrate.

Conductor caps 28 may be totally eliminated from an embodiment, for example, if connection to the substrate is not required (e.g. some capacitor applications). In FIG. 3, an embodiment is shown with a large cap window 39, no insulating caps over conductors 26, and a thin conformal layer 30 (which may be as thin as can be produced with reliable coverage of the underlying structure). The extremely high selectivity of the aforementioned $O_2$ plasma etch allows for complete removal of organic-containing layer 32 in contact window 41 (including the underlying portion of insulated gap 29), without disturbing layer 30. Contact plug 40 is then deposited in window 41. By decreasing the insulation thickness between 40 and 26 (particularly directly above conductors 26, where prior art thickness must be large to compensate for notching), this embodiment may advantageously provide a large capacitance between contact 40 and conductors 26.

Figure 4:
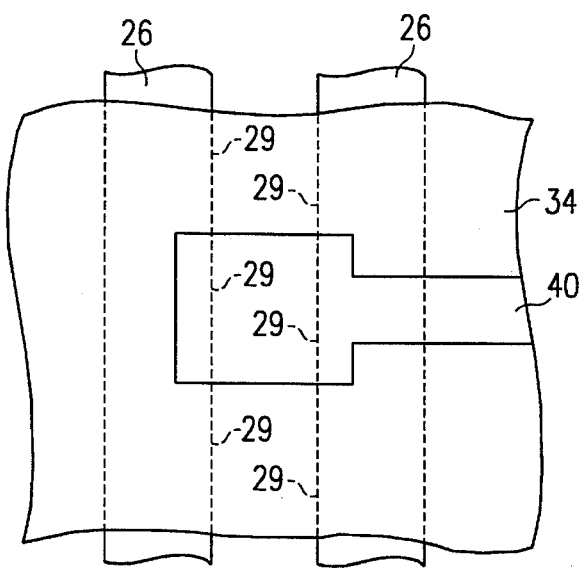
FIG. 4 shows a top view of a typical embodiment (which may be applicable to any of the above embodiments) to illustrate lateral positioning of a contact.

FIG. 4 shows a top view of an embodiment of the invention to illustrate another possible advantage of the present invention. Although contact plug 40 preferably occupies a lateral portion of gap 29 between conductors 26 (which include, e.g., layer 30, not shown), these conductors may typically extend well past the contact plug in a longitudinal direction. In such an instance, the low dielectric constant properties of many organic-containing dielectrics (as compared to oxide or nitride) may advantageously lower crosstalk, switching delays, and power consumption due to undesired capacitance between neighboring conductors 26, in areas other than the location of the contact. These considerations become particularly important for high-aspect, closely spaced conductors, an application to which the present invention is ideally suited.

The following table provides an overview of some embodiments cross-referenced to the drawings.

| Drawing Element | Preferred or Specific Examples | Generic Term | Other Alternate Examples |
| --- | --- | --- | --- |
| 20 | Single-crystal silicon | Substrate | |
| 22 | Thermally-grown oxide ($SiO_2$) | Gate oxide | Silicon nitride |
| 26 | Polysilicon w/ refractory metal silicide overlayer | Conductors | Aluminum, copper, tungsten, platinum, titanium |
| 28 | Thermally-grown oxide | Insulating conductor cap | CVD oxide, silicon nitride, doped oxides, silicon oxynitride |
| 30 | Thermally-grown oxide | Conformal dielectric layer | CVD oxide, silicon nitride, silicon oxynitride |
| 32 | Allied Signal 515 Series SOG | Organic-containing dielectric layer | Amorphous Teflon, parylene, polyimide |
| 34 | CVD silicon dioxide | Inorganic cap layer | Inorganic SOG, silicon nitride, doped oxides, silicon oxynitride |
| 36 | | Photoresist | |
| 40 | Tungsten w/ refractory metal underlayer | Contact plug | Aluminum, polysilicon, copper, titanium, tantalum, titanium nitride, refractory metal silicides |
| 42 | Silicon nitride | Conformal dielectric overlayer | Thermal oxide, CVD oxide |

The invention is not to be construed as limited to the particular examples described herein, as these are to be regarded as illustrative, rather than restrictive. The invention is intended to cover all processes which do not depart from the spirit and scope of the invention. For example, dopants may be introduced to the substrate at various points during the practice of the invention. A gate oxide is not critical to the invention, as the invention may be practiced, e.g., using conductors constructed over field oxide. Either the organic-containing or cap layer may be planarized, e.g. by chemical-mechanical polishing or blanket etchback techniques, during the practice of the invention.

What is claimed is:

1. A method of fabricating a self-aligned contact on a semiconductor device comprising:

(a) providing two separated conductors on a substrate;

(b) forming a conformal dielectric layer over said conductors and said substrate, thereby creating an insulated gap having a first width between said conductors;

(c) depositing an organic-containing dielectric layer over said conductors and said substrate to a depth sufficient to completely cover said conductors and fill said insulated gap;

(d) depositing an inorganic cap layer over said organic-containing dielectric layer;

(e) etching a cap window through said cap layer, said cap window substantially vertically aligned with said gap and having a second width greater than said first width; and (f) etching a contact window through said organic-containing dielectric layer, using said cap window as a mask for said contact window, and using an etchant which does not substantially affect said conformal dielectric layer, whereby a lower portion of said contact window is laterally confined to said insulated gap, and whereby said conformal dielectric layer is left substantially intact by said etching steps.

2. The method of claim 1, wherein said conductors each contain an insulating conductor cap.

3. The method of claim 2, further comprising: anisotropically etching exposed portions of said conformal dielectric layer in said contact window to expose said substrate in at least a portion of said insulated gap; and depositing a conducting material in said contact window to provide electrical contact to said substrate.

4. The method of claim 1, wherein said forming a conformal dielectric layer step comprises:

(a) depositing dielectric material conformally over said conductors and said substrate;

(b) anisotropically etching said dielectric material such that said dielectric material is substantially removed from horizontal surfaces of said conductors and said substrate; and (c) depositing a conformal dielectric overlayer over said conductors and said substrate.

5. The method of claim 1, wherein said conformal dielectric layer is comprised of materials selected from the group consisting of thermally-grown oxide, CVD silicon dioxide, doped oxide, silicon nitride, silicon oxynitride, and combinations thereof.

6. The method of claim 1, wherein a patterned photoresist layer overlying said cap layer is used to facilitate said etching a cap window through said cap layer step, and wherein said etching a contact window through said organic-containing dielectric layer step simultaneously removes said photoresist layer.

7. The method of claim 1, wherein said organic-containing dielectric layer acts as an etch stop for said etching a contact window through said cap layer step.

8. The method of claim 1, wherein said organic-containing dielectric contains between 10 and 100 percent by weight organic material.

9. The method of claim 8, wherein said organic-containing dielectric consists essentially of said organic material and silicon dioxide.

10. A method of fabricating a self-aligned contact on a semiconductor device comprising:

(a) providing two separated conductors formed on a substrate, said conductors having insulating conductor caps;

(b) forming a conformal dielectric layer over said conductors and said substrate, thereby creating an insulated gap between said conductors;

(c) depositing an organic-containing dielectric layer over said conductors and said substrate to a depth sufficient to completely cover said conductors and fill said insulated gap;

(d) depositing an inorganic cap layer over said organic-containing dielectric layer;

(e) depositing a photoresist layer over said cap layer and patterning an etch window through said photoresist layer, said etch window being substantially vertically aligned with and being wider than said insulated gap;

(f) etching a cap window through said cap layer, using said etch window as a mask for said cap window, and using said organic-containing dielectric layer as an etch stop;

(g) etching a contact window through said organic-containing dielectric layer, using said cap window as a mask for said contact window, and using an etchant which does not substantially affect said conformal dielectric layer, said etching a contact window step also removing said photoresist layer;

(h) anisotropically etching exposed portions of said conformal dielectric layer in said contact window to expose said substrate in at least a portion of said insulated gap; and (i) depositing a conducting material in said contact window to provide electrical contact to said substrate, whereby an electrical contact to said substrate is laterally positioned by said insulated gap, and whereby capacitive coupling between said conductors is decreased, as compared to a solid silicon dioxide dielectric.

11. The method of claim 10, further comprising, before said depositing an inorganic cap layer step, thinning said organic-containing layer with a blanket etchback.

* * * * *